United States Patent
Dykaar

(10) Patent No.: US 7,106,928 B2
(45) Date of Patent: Sep. 12, 2006

(54) COUPLING HIGH POWER OPTICAL SOURCES TO SMALL DIAMETER FIBERS

(76) Inventor: Douglas R. Dykaar, 465 Kingsford Place, Waterloo, Ontario (CA) N2T 1K9

( * ) Notice: Subject to any disclaimer, the term of this patent is extended or adjusted under 35 U.S.C. 154(b) by 0 days.

(21) Appl. No.: 11/143,565

(22) Filed: Jun. 3, 2005

(65) Prior Publication Data

US 2005/0220403 A1    Oct. 6, 2005

Related U.S. Application Data

(63) Continuation-in-part of application No. 10/347,488, filed on Jan. 21, 2003, now Pat. No. 6,904,198.

(60) Provisional application No. 60/350,757, filed on Jan. 22, 2002.

(51) Int. Cl.
*G02B 6/26* (2006.01)

(52) U.S. Cl. ............................. 385/31; 385/27; 385/124

(58) Field of Classification Search ................... 385/12, 385/24, 27, 31, 37, 50, 123–128; 372/6, 372/96, 102
See application file for complete search history.

(56) References Cited

U.S. PATENT DOCUMENTS 5,422,897 A    6/1995  Wyatt et al.
5,530,710 A    6/1996  Grubb
5,659,644 A    8/1997  DiGiovanni et al.
5,774,484 A    6/1998  Wyatt et al.
6,904,198 B1 *  6/2005  Dykaar ........................ 385/31

OTHER PUBLICATIONS

"New Termination Process Enables Cost-Effective Manufacturing of Tunable Optical Fibers", Northrop Grumman, Tech of the Week.
"Development of Holey Fiber Supporting Extra Small Diametr Bending", Nishioka et al, Information and Comm. Systems, SEI Technical Review No. 58, Jun. 2004, p. 42-47.

* cited by examiner

*Primary Examiner*—Phan Palmer
(74) *Attorney, Agent, or Firm*—Teitelbaum & MacLean; Neil Teitelbaum; Doug MacLean

(57) ABSTRACT

The present invention relates to coupling high power optical sources into small diameter optical fibers. In a first embodiment, an optical source is provided to the side of a fiber. The fiber is a single mode fiber, which has a cladding and a core, with a Bragg grating written into the core at a low angle. Light emitted from the optical source is index-match coupled into the cladding by using an index-matched element, and subsequently coupled into the fiber core along its length. Alternatively, the light is launched into an end of a larger diameter fiber with a mode reducing means, e.g. long period grating, therein for directing the light into the small diameter fiber.

20 Claims, 20 Drawing Sheets

COUPLING HIGH POWER OPTICAL SOURCES TO SMALL DIAMETER FIBERS

CROSS-REFERENCE TO RELATED APPLICATIONS

This application is a continuation-in-part of U.S. patent application Ser. No. 10/347,488 filed Jan. 21, 2003, now U.S. Pat. No. 6,904,198, which claims priority of U.S. Patent Application No: 60/350,757 filed Jan. 22, 2002, which are incorporated herein by reference.

FIELD OF THE INVENTION

This invention relates to coupling light into optical fibers, and in particular to a coupling high power optical sources into small diameter optical fibers.

BACKGROUND OF THE INVENTION

Conventional techniques for coupling light into optical fibers introduces the light into the end of the fiber. Unfortunately, this limits the area available for coupling light to what amounts to a point, which is typically less than 10 microns in diameter, for a single-mode fiber. Even in the case of cladding-pumped fibers, the diameter of the cladding is still only on the order of several hundred microns. Moreover, some form of coupling optic, e.g. in the form of a discrete lens or a lens formed onto the end of the fiber, would also be required to couple the laser emission into the fiber.

FIGS. 1A and 1B illustrate end views for existing fiber configurations. The fiber illustrated in FIG. 1A is a small diameter fiber, e.g. a single mode fiber, and includes a core 2 and a cladding 4. The fiber illustrated in FIG. 1B is a double clad fiber, and includes an inner core 6, a secondary core (cladding) 8 and an outer cladding 10.

The index of the core 2, see FIG. 1A, can be stepped with respect to the gladding or graded; however, the light that is coupled into a propagating mode in the fiber must satisfy the total internal reflection criteria of Snell's law. This limits the area over which light can be coupled into the fiber to the approximate size of the core 2. Enlarging the core 2 beyond this limit results in multi-mode propagation.

With reference to FIG. 1B, the larger secondary core 8 is provided for propagating multimode pump light. The small diameter single-mode central core 6 can be doped with atomic gain species, such as erbium. The pump light excites the gain species as it passes back and forth across the central core 6, converting light at the pump wavelength to light at gain species emission wavelength.

Both approaches place significant restrictions on the allowable optics and power levels that can be used. Typically, the damage threshold of the fiber-end surface limits the power that can be couple into the fiber.

The larger size of the multi-mode core 8 allows a relatively larger diode pump array to be end-coupled onto the fiber. However, the pump laser is still limited to the area of the fiber cladding 10, which is typically less than 500 µm in diameter.

Fiber gratings have been available for several years. Conventionally, Side Tape Gratings (STG) and Long Period Gratings (LPG) have been used to couple light out of a fiber. For the STG, the angle at which the radiated light is coupled out of the fiber is: $\cos[\theta(\lambda)] = 1/n_{clad}(\lambda/\Delta_g \ N\cos \ \theta_{g-neff}(\lambda))$; where, $n_{clad}$=Cladding Index; $n_{eff}(\lambda)$=Effective index at wavelength, $\lambda$;

$\theta(\lambda)$=Wavelength dependent angle subtended by light radiated out of the core;
$\theta_g$=Grating period;
$\Delta_g$=Tilt of the grating with respect to the propagation direction; and
N=Order of the grating.

While these types of gratings are described as exemplary types of fiber gratings, the function they serve may be generated using other types of induced index change within the fiber to cause coupling of incident light along the length of the fiber to the core of the fiber. An example of such a structure is a regular pattern of notches along the length of the fiber, which, like a grating have a period as described in the above equation.

The approach described above has been used previously as a way to filter or reject unwanted light or to couple light out of a fiber to a power-monitoring device. It is, therefore, desirable to provide a new optical device that can couple light into an optical fiber to achieve higher coupled power.

Conventional fiber lasers, such as those disclosed in U.S. Pat. No. 5,422,897 issued Jun. 6, 1995 to Wyatt et al; U.S. Pat. No. 5,530,710 issued Jun. 25, 1996 to Grubb; U.S. Pat. No. 5,659,644 issued Aug. 19, 1997 to DiGiovanni et al; U.S. Pat. No. 5,774,484 issued Jun. 30, 1998 to Wyatt et al; and U.S. Pat. No. 5,940,557 issued Aug. 17, 1999, include a multi-mode optical fiber section disposed between an optical source and a single mode fiber section in an effort to input as much light as possible into the single mode fiber section. Unfortunately, most of the aforementioned references rely on wavelength conversion and forcing light into the cladding of the single mode fiber section before transmission in the core thereof is possible.

Devices requiring wavelength conversions provide limited wavelengths, which are dependent upon the available rare-earth material, while cladding pumped lasers results in considerable attenuation unless specially designed cladding is provided

SUMMARY OF THE INVENTION

An object of the present invention is to overcome the shortcomings of the prior art by providing an optical device that enables high power optical sources to be coupled into small diameter optical fibers without wavelength conversion.

Accordingly, the present invention relates to an optical device for increasing the amount of optical power coupled into an optical fiber comprising:

a light source for generating a beam of source light;

an optical fiber having a first region including a first cladding and a first core optically coupled to the light source, and a second region a second cladding and a second core remote from the light source;

a mode reducing means in the first region for directing at least a portion of the beam of source light from the light source into the second region;

an output coupler in the second region for reflecting at least a portion of the beam of source light back towards the first region.

Other aspects and features of the present invention will be readily apparent to those skilled in the art from a review of the following detailed description of preferred embodiments in conjunction with the accompanying drawings.

BRIEF DESCRIPTION OF THE DRAWINGS

The invention will be further understood from the following description with reference to the drawings in which.

DETAILED DESCRIPTION OF THE PREFERRED EMBODIMENTS

Figure 1B:
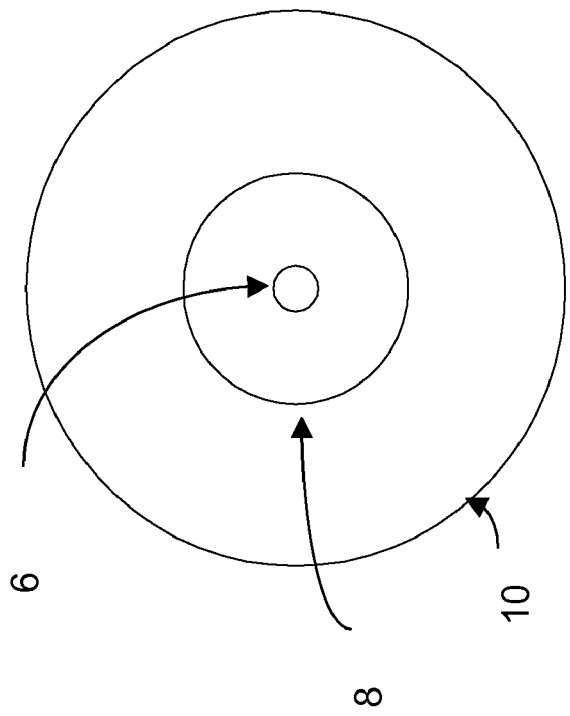
FIG. 1B is a schematic cross-sectional end view of another conventional fiber configuration.
Figure 1A:
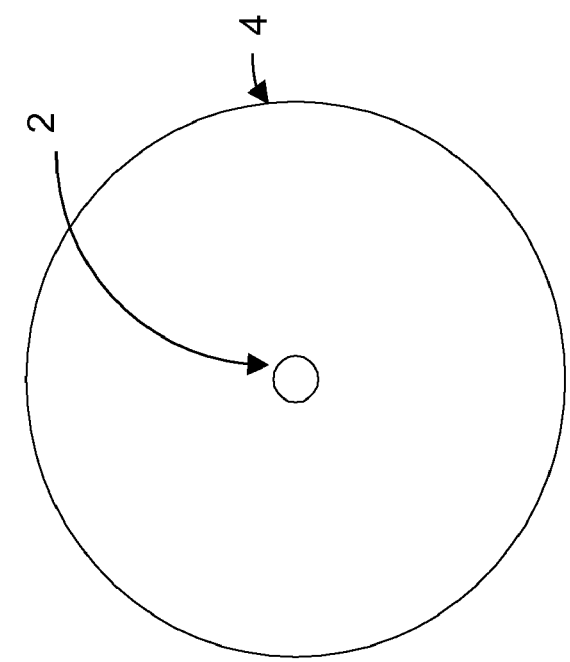
FIG. 1A is a schematic cross-sectional end view of a conventional fiber configuration.
Figure 2:
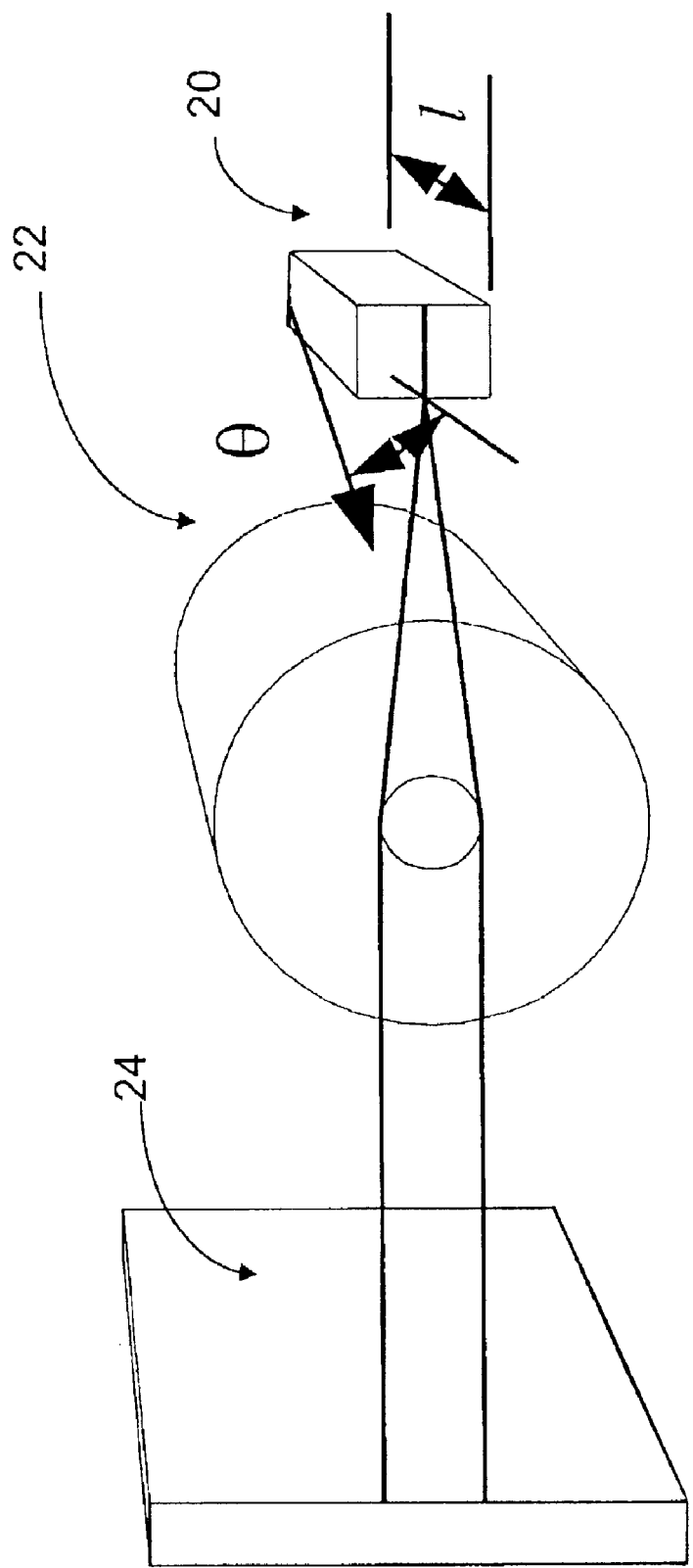
FIG. 2 is a schematic perspective view of a device for coupling light into a fiber in accordance with an embodiment of the present invention.

FIG. 2 is a schematic perspective view of a device for coupling light into an optical fiber 22 in accordance with an embodiment of the present invention. The optical fiber 22 is a single-mode fiber and has a core and a cladding. The device shown in FIG. 2 includes an optical source 20, e.g. laser diode source of length "l", which is close coupled at an angle "θ" to a fiber grating formed within the core of the fiber 22. A mirror 24 or an alternative reflective optic may be provided to allow light, which is not coupled into the fiber 22, to be reflected back onto the grating. In the event the grating has sufficiently high reflectivity, the external mirror 24 becomes unnecessary. The device of FIG. 2 may be a fiber laser. "l" is the length of the laser stripe. "θ" is the angle at which the light is emitted, and is eventually matched to the fiber grating tilt angle. The laser emission angle may be different from the fiber tilt angle.

Figure 3:
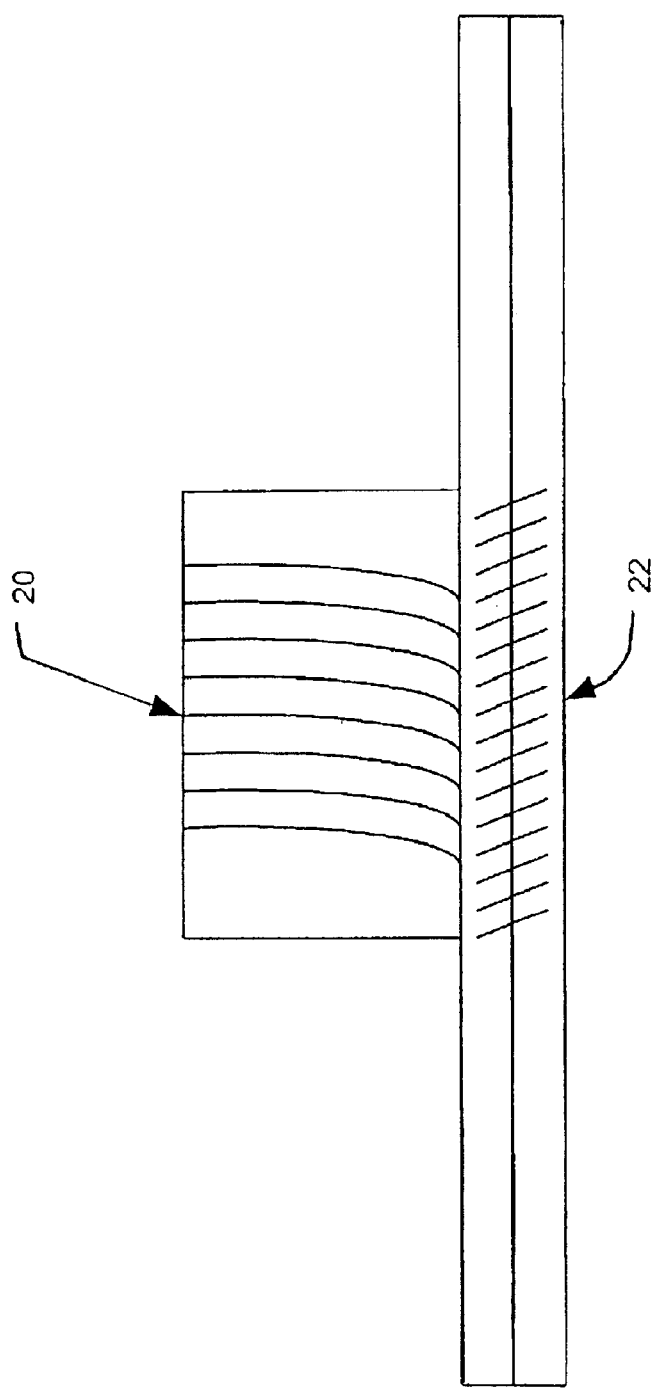
FIG. 3 is a schematic diagram showing one example of close-coupled arrangement of the optical source shown in FIG. 2.

FIG. 3 illustrates one example of close-coupled arrangement of the optical source of FIG. 2. In FIG. 3, the laser (source) elements are perpendicular to the back surface to form (optionally coated) high reflectors at the rear of the optical source 20, and are curved at the output (possibly coated) to match the angle required by the tilted grating. The optical source can arranged to emit at near Brewster's angle for minimum loss. If the laser elements and the tilted grating are properly designed, no other optics would be required.

Light is coupled into the fiber 22 along its length, thus increasing the power, which can be effectively coupled into the fiber 22. This also simplifies the mechanical requirements on the coupling optics, as light can be distributed linearly along the length of the fiber 22, as opposed to being focused onto what amounts to a point on the cross-section of the fiber core. In addition, the distributed nature of the coupling tends to spatially average the noise present in the pump laser (e.g. optical source 20-laser diode source), which is coupled into the fiber 22 from the pump laser. Light is coupled into the fiber 22 using the grating formed within the fiber 22. The coupling is easy to implement in practice since the alignment is oriented along the length of the fiber 22, as opposed to the end, i.e. along a line versus a point.

In the fiber 22, a low-angle, tilted Bragg grating is used. Preferably, the grating is a Bragg grating written into the fiber 22 at less than about 20° with respect to the length of the fiber 22. The grating of the fiber 22 may be written to achieve high reflectivity, e.g. 100% reflectivity. The low-angle tilted-grating of the fiber 22 maximizes the coupling of light from the core to the cladding, or vice-versa.

Bragg gratings are formed in fibers using optical interference to create a region where intensity variations in the light interact with the glass of the fiber to change the index in regions of higher intensity. The interference is created by directly interfering two laser beams at an angle, or by using plus and minus diffraction orders from a phase mask. In all cases a range of factors determines the spatial extent of the interference region including optical element quality, mechanical stability, optical coherence length, etc. In order to obtain the tilt in the desired grating, the fiber is tilted in the interference region. As the fiber is tilted, the length of the fiber inside the interference region will be reduced. For a given grating writing arrangement, therefore, the maximum strength of grating will be obtained if the angle of the grating is kept small, e.g. less than 20°. The longer the physical extent of the grating, the larger the number of alternating regions high and low relative index in the grating region and the higher the effective coupling to the core.

The angled gratings are described in Kashyap R. "Fiber Bragg Gratings" Academic Press, NY, 1999, Chapter 3, Section 3.1.4, pp 69–71; "Novel and improved methods of writing Bragg gratings with phase masks," Othonos, A.; Xavier Lee, IEEE Photonics Technology Letters, (7) 10, October 1995, 1183–1185; and "Chirped fibre gratings produced by tilting the fibre," Chandonnet, A.; Lauzon, J.; Painchaud, Y., Electronics Letters, (31) 3, 2 Feb. 1995, 171–172, which are incorporated herein by reference.

The level of coupling achievable in conventional Bragg-gratings is in the range of a few percent. In the embodiment of the present invention, the grating is implemented in the fiber 22 to form an output coupler of a laser cavity, such that the strength of the grating is now of an appropriate value, which increases the coupling of light into the fiber 22. In the simplest configuration, the optical source 20, e.g. laser diode source or diode array, with a gain stripe angled relative the cleave plane, is close coupled to the grating shown in FIG. 2. This is in contrast to an end-coupled arrangement, wherein the axis of the light is preferably transverse to the cleaved end of a fiber.

Ideally, the light is index-match coupled into the cladding of the fiber 22, which occurs when the coupling medium has essentially the same index as the cladding. In this way, light is brought from outside the fiber 22 directly to the core-cladding interface at the appropriate angle so as to couple the grating within the core. By minimizing the mechanical operations that the fiber 22 is subject to, risk of failure due to breakage is minimized.

The external configuration of the coupling optic allows light to direct from the optical gain medium to the grating such that the optical field pattern is optimally mapped onto the grating. There are many ways in which this can be achieved using standard combinations of optics, including lenses and gradient-index glass, as well as tailoring of the grating within the fiber to match a particular configuration. The tailoring can take the form of a chirp in the profile, or patterning of discrete sections to match discrete gain regions in a multiple stripe diode-gain element for example.

There are many examples of the coupling optics for coupling light out of fibers, such as Wagener, J. L., Strasser, T. A., Pedrazzini J. R., DeMarco J. and Giovani D. J. "Fiber Grating Optical Spectrum Analyzer Tap", ECOC-97, Sep. 22–25, 1997, Conference Publication No. 448, IEE, pp 65–68. Many of the coupling geometries, which are conventionally used between fibers and detectors, are applicable to the device in accordance with the embodiment of the present invention.

The grating of the fiber 22, the optical source 20, e.g. laser diode source, and the coupling optics are at sufficiently separated in wavelength so that the individual units do not interfere in multiple wavelength configurations. Coupling may be desirable; however, and can be designed for within the gain medium.

Figure 5:
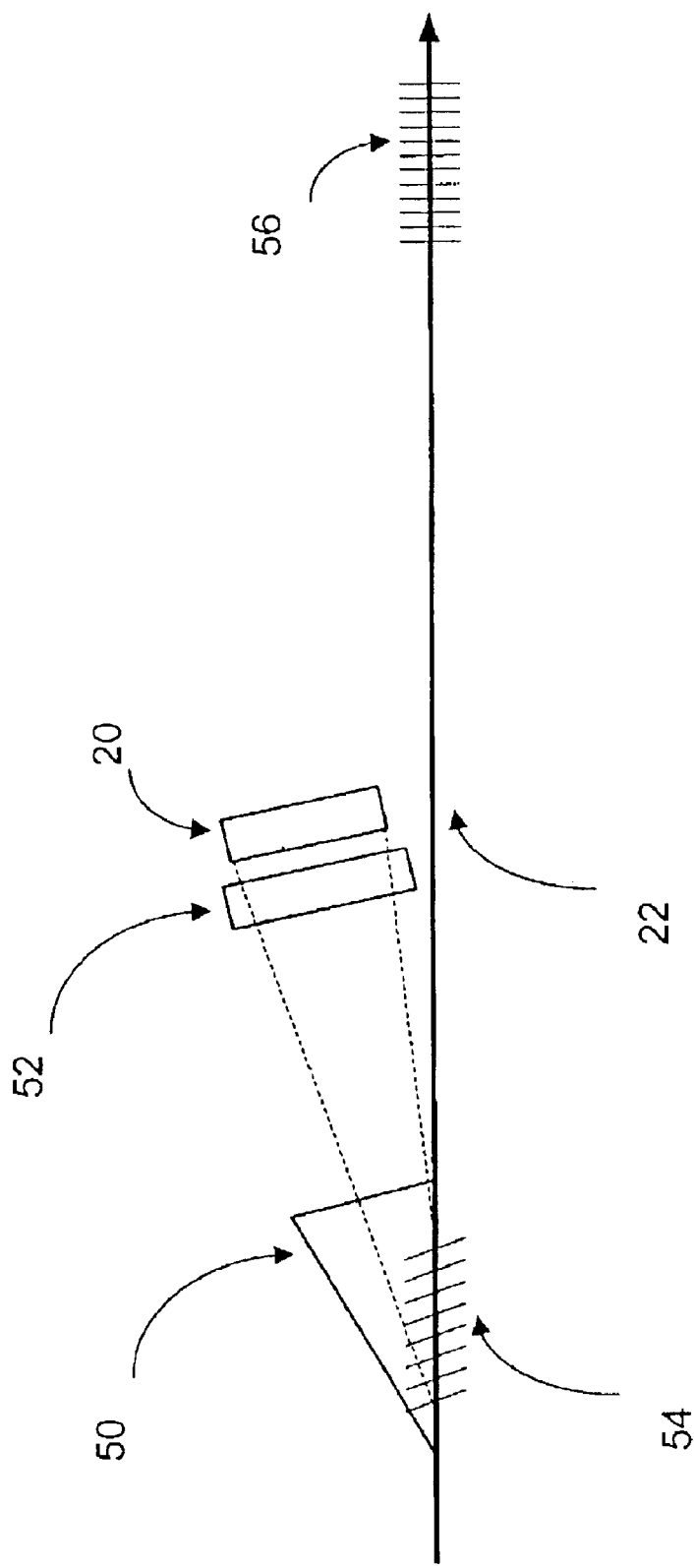
FIG. 5 is a schematic diagram showing one example of the device shown in FIG. 2.

In FIG. 2, the optical source 20 is illustrated as a single laser diode source; however, the optical source 20 may instead be an array of laser diodes. The laser diode may have single or multi-elements. The optical source 20, e.g. a laser diode, may be optically coupled or close-coupled to the grating (FIG. 3). The optical source 20 may be any type of a self-contained laser source, an extended cavity, or an extended cavity including the fiber and downstream fiber-grating output-coupler (FIG. 5). Multiple sources may be used to provide redundancy. Preferably, laser diode bars are used for their reliability. The optical source 20 may generate single or multi wavelengths, and may output Continuous Wave (CW) or pulsed.

Figure 4:
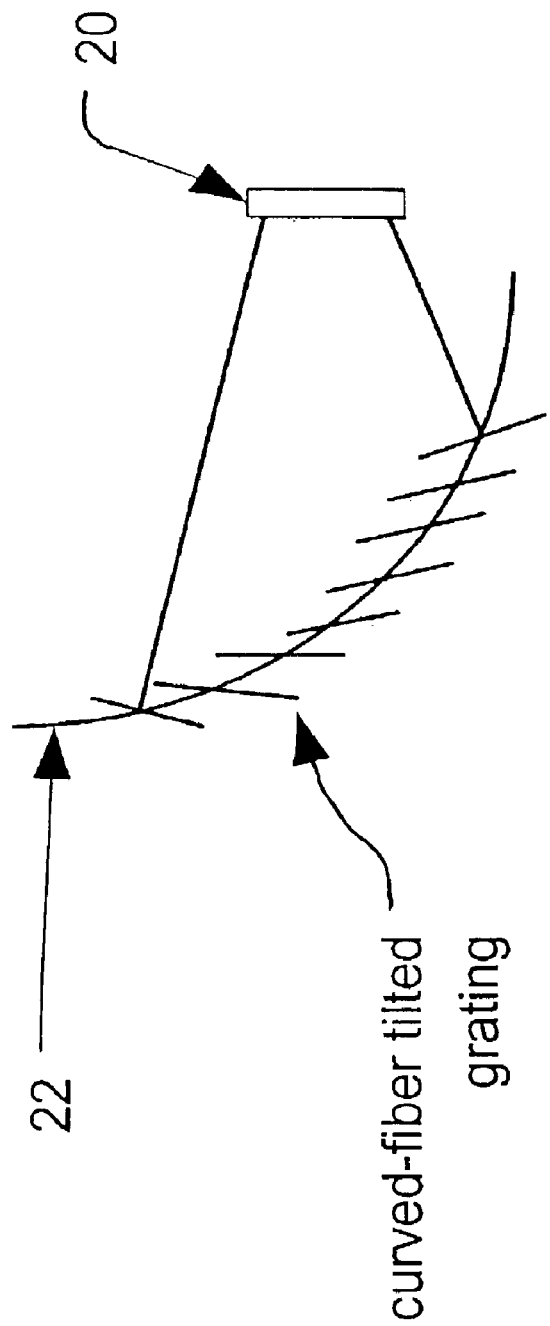
FIG. 4 is a schematic diagram showing a curved-fiber 22 of FIG. 2.

The fiber 22 may be a shaped fiber, e.g. either shaped cladding or core, such as "D" cladding or oval core profile. The shaped fiber reduces the possible extent of the grating within the cladding. The fiber 22 may be a curved fiber as illustrated in FIG. 4. The curved fiber 22 of FIG. 4 has a tilted grating, which is curved so as to focus directly onto the optical source 20. For adjusting the focus, some lenses may be used.

FIG. 5 illustrates another embodiment of the present invention in which the fiber 22 includes a first grating 54 and a second grating 56. The arrow illustrated in FIG. 5 shows a light flow (downstream) direction. The beam light from the optical source 20 is emitted to the first grating 54. Leakage in the backward direction can be used to illuminate a power monitor (not shown).

The fiber 22 has a core of index $n_1$ and a cladding of index $n_2$ ($n_1 > n_2$: $n_2$ may be stepped or graded-index). The fiber 22 may be doped or modified, e.g. hydrogen loaded, to facilitate grating production or doped or modified in other ways. The fiber 22 may be doped with gain material, such as Erbium, Ytterbium to form a laser amplifier. The fiber 22 may include a semiconductor gain medium to form a semiconductor laser. The first grating 54 is a side-tapped low-angle high-reflectivity grating, which is written in the core of the fiber 22.

The second grating 56 serves as an output coupler and defines a cavity, if a laser diode is used in an extended configuration. The second grating 56 may also be tilted to couple light out the side in high power applications. The second grating 56 may be chirped or multiple-discrete to generate multiple wavelengths.

An index matched coupling optic 50 with index $n_3$ is optically coupled to the fiber 22, such that light is index-match coupled into the cladding at the area of the first grating 54. The index matched coupling optic 50 may be one or more of a lens, a mirror or a prism. The index matched coupling optic 50 is coupled to the fiber 22, using index matched material, such as one or more of the following: glues, gels, and oil, bonded or built up by deposition. The index $n_3$ of the coupling optic 50 is equal or greater than the index $n_1$ of the core. The index $n_3$ may be equal to the index $n_2$ of the cladding.

The index matched coupling optic 50 may be placed, glued or held up to a polished flat spot of the fiber 22, e.g. a part of the cladding is removed by polishing and replaced with the index-matched material, whereby the coupling optic 50 then optically couples the optical source 20 to the fiber 22 through the index-matched material.

This allows cladding material that may have the grating written into it to be removed. The optical source 20 may be coupled to the fiber 22 or free space coupled.

A focusing optic 52 may be provided to the optical source 20 for collecting the output of the optical source 20, and focusing it into the side-tapped low-angle high-reflective first grating 54. The focusing optic 52 may be integrated into the index matched coupling optic 50.

In FIG. 5, the device includes one optical source 20 for the fiber 22. However, the device may include more than one optical source 20 for the fiber 22.

Figure 6:
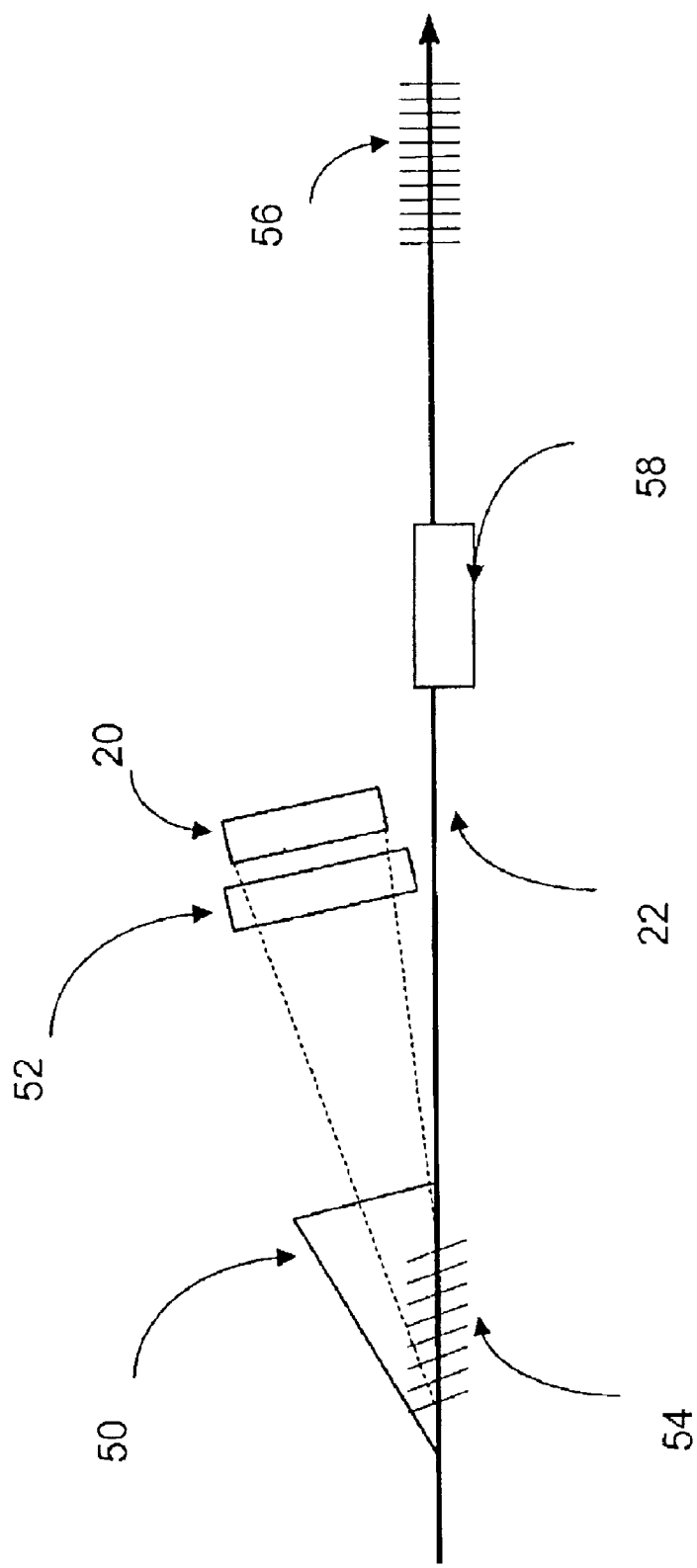
FIG. 6 is a schematic diagram showing the device of FIG. 5 with a filter.

As illustrated in FIG. 6, the fiber 22 may include a filter 58, e.g. an intra cavity filter or an extra-cavity filter. The filter 58 can be a band pass filter. The filter 58 can cause the signal to be discrete or channelized independent of the optical source 20. The filter 58 can have channel dependent amplitudes to match external amplifiers. Channel width on the fiber 22 can be changed with the filter 58 as shown in FIG. 7(A). The filter 58 may be an interleaver, which is a passive device having a feature shown in FIG. 7(A), that defines multiple wavelengths at desired wavelengths and spacing. For example, with many laser diode stripes defined, the filter 58 is used to control the width of the individual channels.

Figure 7B:
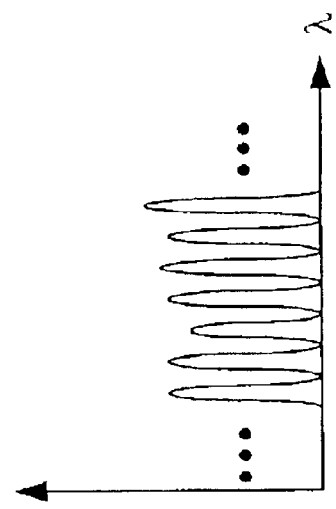
FIGS. 7(A) and 7(b) are graphs illustrating examples of the features of the filter illustrated in FIG. 6.
Figure 7A:
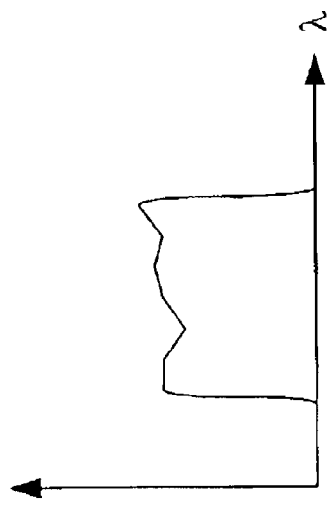

The filter 58 may be a gain flattening filter as shown in FIG. 7(B) for controlling amplitude so that an external amplifier produces a flat amplitude in response to wavelength.

Figure 8A:
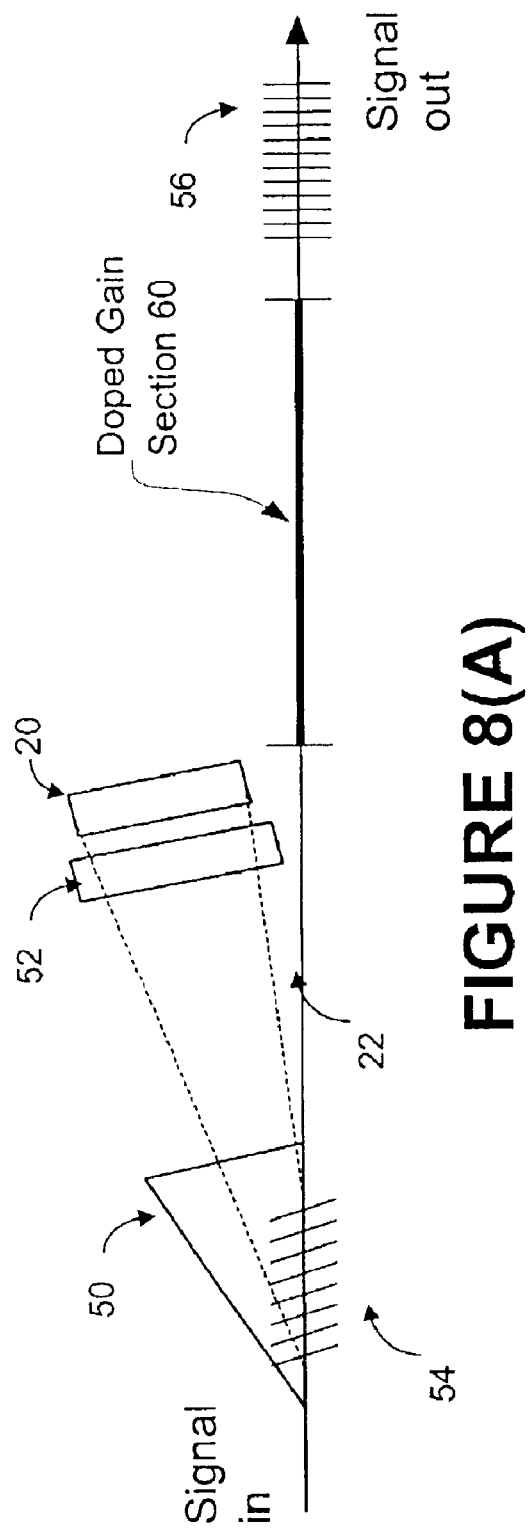
FIG. 8(A) is a schematic diagram showing an amplifier application based on the device of FIG. 6.
Figure 8B:
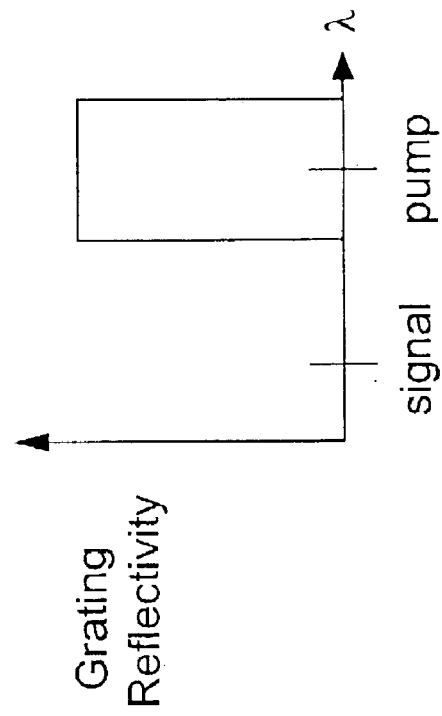
FIG. 8(B) is a graph showing one example of the feature of the amplifier shown in FIG. 8(A)

The device shown in FIG. 5 is also applicable as an optical fiber amplifier. With reference to FIG. 8A, the fiber 22 includes an amplifier medium, e.g a rare-earth doped section 60 (an intra cavity element), in which the rare-earth is inside the cavity region of the fiber 22. The rare-earth doped section 60 is located between the first and second gratings 54 and 56. As illustrated in FIG. 8(B), the second grating 56 reflects light at the pump wavelength. Signal input to the fiber 22 passes through the section 60. The pump wavelength may be visible, infra-red or ultra-violet. The first and second gratings 54 and 56 are as close to 100% reflectivity as available. The doped intra cavity element with the first and second gratings 54 and 56 provides higher pump power for the amplifier.

Figure 9:
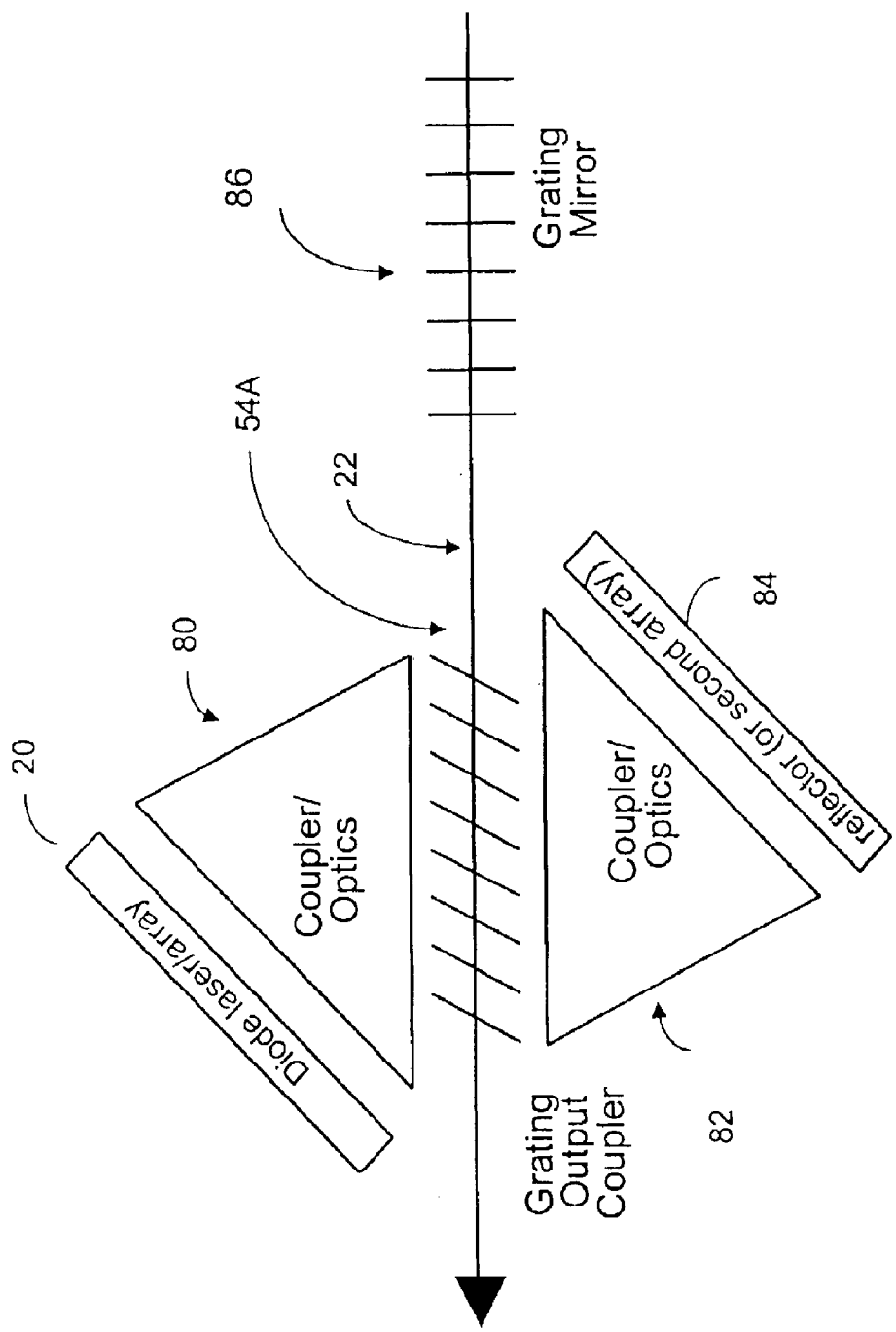
FIG. 9 is a schematic diagram showing a further example of the device shown in FIG. 2.

FIG. 9 shows a further example of the device shown in FIG. 2. In FIG. 8, a coupler/optics 80 is provided between a lower reflectivity tilted first grating 54A and the optical source 20 (e.g. diode laser/array), and further a coupler/optics 82 is provided between the first grating 54A and another optical source 84. The first grating 54A is a low reflector. The optical source 84 may be a reflector or a second diode laser/array to provide light into the first grating 54A. The optical source 84 may be attached to the fiber 22 in the similar geometry and manner as the optical source 20. The fiber 22 of FIG. 8 further includes a standard fiber Bragg-grating 86 that acts as a mirror.

In the arrangement of FIG. 9, some light goes through the first grating 54A. The source on the opposite side is therefore part of the cavity defined by the two optical sources 20 and 84, e.g. laser arrays. The tilted first grating 54A acts as a bi-directional output coupler. The grating mirror 86 acts as a high reflector and reflects light back so that the output is unidirectional. The same arrangement may be used in a ring configuration, without the grating mirror 86.

Figure 10:
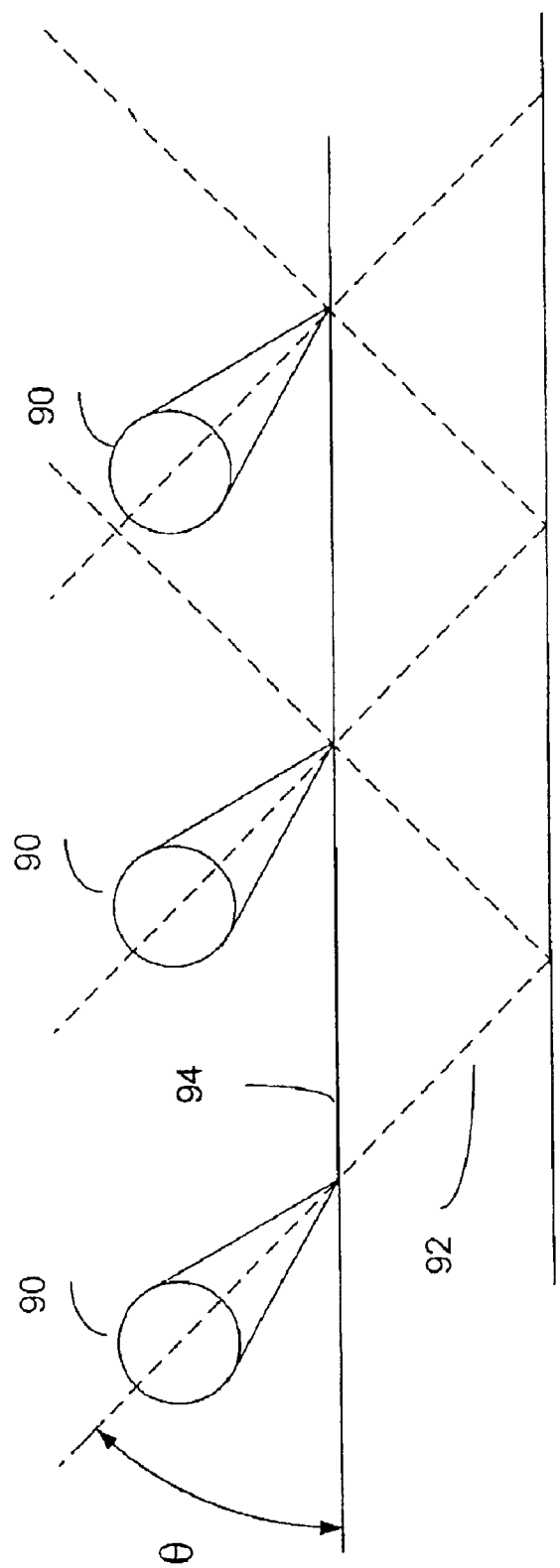
FIG. 10 is a schematic diagram showing a first example of the electrode pattern of the laser diode shown in FIG. 2.

FIG. 10 illustrates one example of the electrode pattern of the optical source 20, e.g. laser diode, shown in FIG. 2. In FIG. 10, an emission is illustrated by the numeral 90 and an electrode pattern is illustrated by the numeral 92. As illustrated in FIG. 10, the laser diode 20 may be fabricated or modified to emit light at an angle "θ" relative to the cleave plane. Although stray light will be reflected off the back surface 94 of the laser facet, an anti-reflection (AR) coating may be used to minimize this effect. Although the output facet is preferably at Brewster's angle to minimize reflections, an AR coating may be used to passivate the surface 94.

Figure 11B:
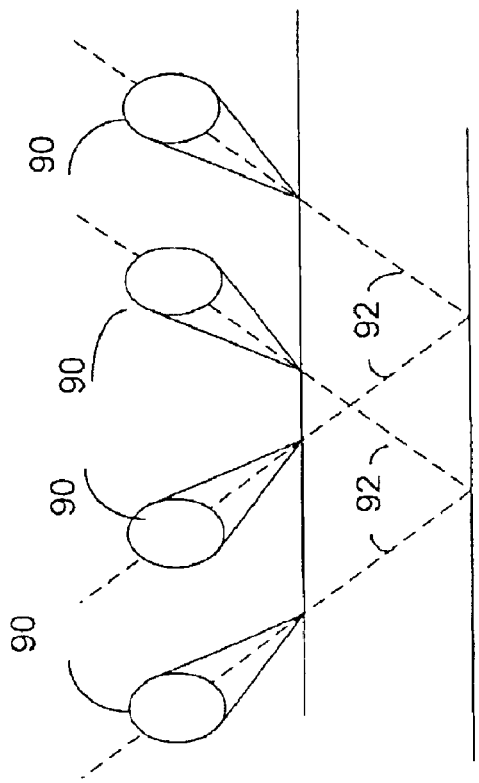
FIG. 11(B) is a schematic diagram showing a third example of the electrode pattern of the laser diode shown in FIG. 2.
Figure 11A:
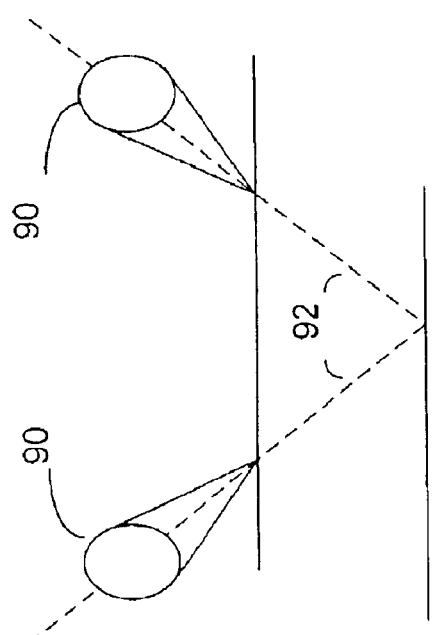
FIG. 11(A) is a schematic diagram showing a second example of the electrode pattern of the laser diode shown in FIG. 2.

FIGS. 11(A) and 11(B) illustrate further examples of the optical source 20 shown in FIG. 2. As shown in FIGS. 11(A) and 11(B), the electrode 92 may be applied in a "V" or "W" pattern to produce laser emission in two different directions. The emission is then coupled to the fiber 22 as described above.

Figure 12:
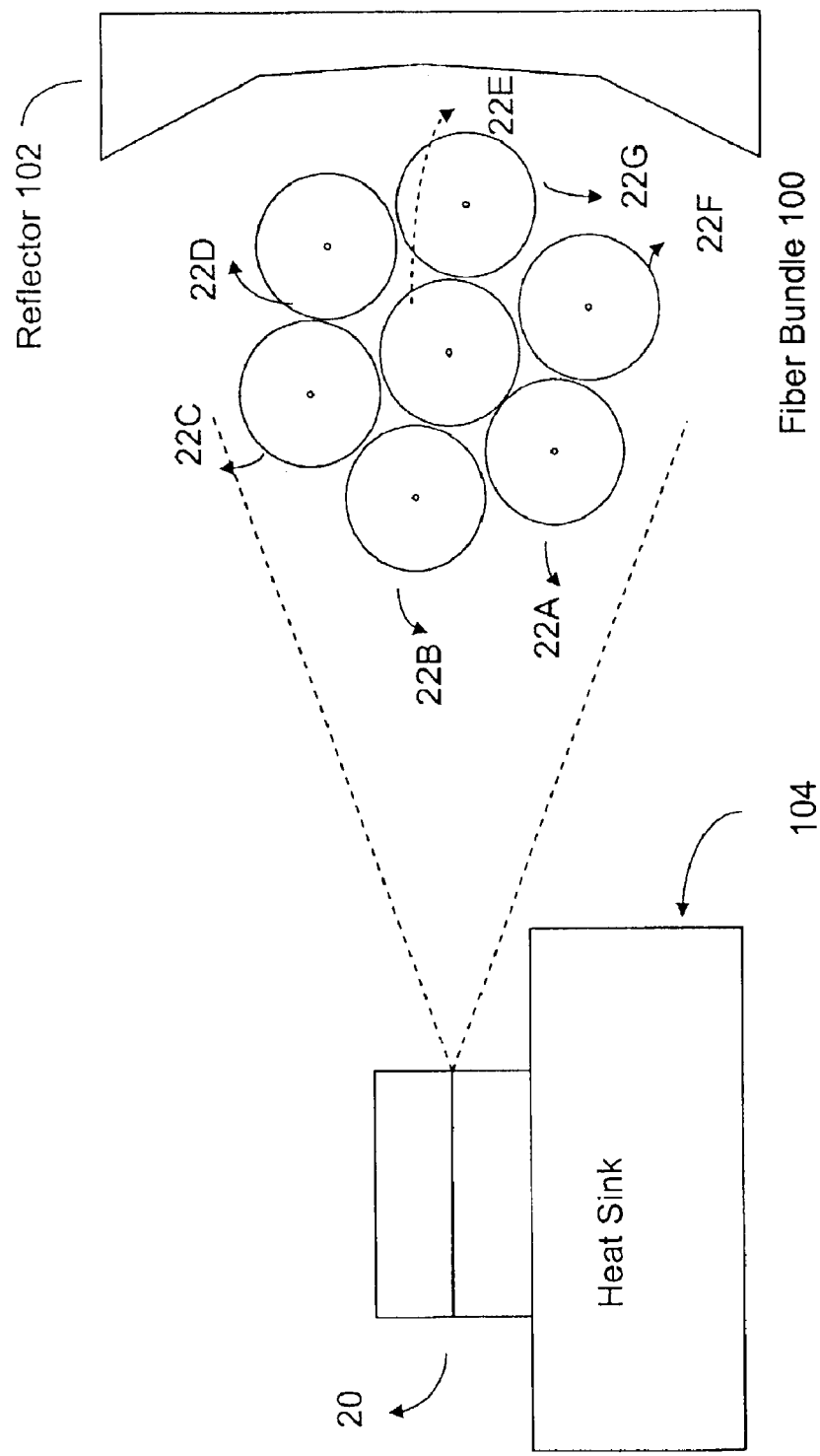
FIG. 12 is a schematic diagram showing the device of FIG. 2 with a fiber-bundle.

The single fiber 22 may be replaced by multiple fibers in a bundle 100, illustrated in FIG. 12, which illustrates a further example of the device shown in FIG. 2. The device illustrated in FIG. 12 includes an optical source 20, e.g. a diode bar, the bundle 100, a reflector 102 and a heat sink 104. A coupling optic may be provided. It is noted that in case, multiple bars (e.g. stacked diode bars) may be used, since in this case the optical source 20 is not being imaged onto the grating, but supplying light to a laser cavity, in which light is coupled out through the individual fibers.

The bundle 100 includes a plurality of fibers 22A–22G. The fibers 22A–22G may be interconnected. The fibers 22A–22G are similar to the fiber 22. The grating of each fiber 22A–22G is a tilted grating. Each grating may be chirped or multiple-discrete. The bundle 100 with coupling gratings may be assembled into a composite assembly.

The device shown in FIG. 12 may meet the same angle and tilt condition as those of FIG. 2 to match the laser emission to the entrance angle of the gratings. The bundle 100 may be made up of a single continuous fiber loop, thereby further increasing efficiency.

The multiple wavelengths are now described in further detail. The approach described above is especially applicable to multiple wavelengths. By using broadband semiconductor gain media, for example, individual wavelengths can be selected by the design of grating, simplifying the requirements placed on the design of the semiconductor. In the case multiple wavelengths, the grating can be uniformly chirped or consist of discrete sections of constant wavelength. The grating can be formed by one continuous exposure, or made by multiple exposures using one or more masks. These types of gratings are described in Kashyap (chapter 3, section 3.1.11 to section 3.1.15), which is incorporated herein by reference.

Figure 13:
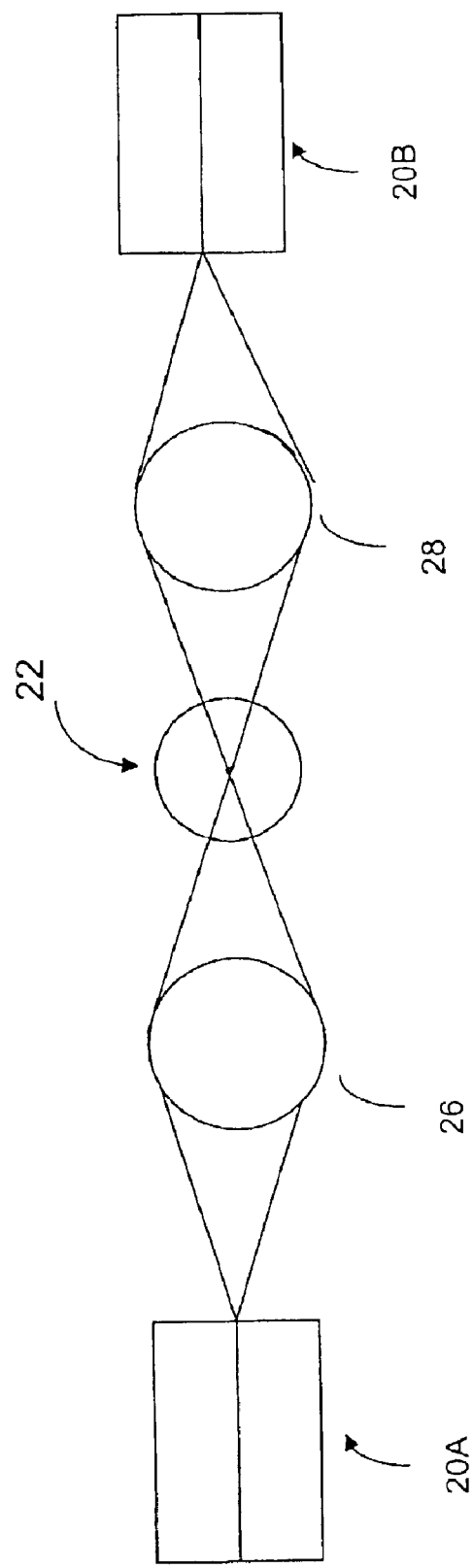
FIG. 13 is a schematic end-view diagram showing symmetrical configuration for the device of FIG. 2.

The device of FIG. 2 may have a symmetrical configuration as illustrated in FIG. 13. In FIG. 13, optical sources 20A and 20B, e.g. first and second laser diode bars, are symmetrically provided to the fiber 22, through coupling optics 26 and 28, respectively.

The device of FIG. 2 may have a ring (loop) configuration. The ring configuration is a well-known approach to laser design. The ring geometry is described in "High Power Side Pumped Unidirectional Ring Yb-Doped Double-Clad Fiber Laser", Hideur A. Chartier T. Sanchez S. Paper CThE50, European Conference on Lasers & Electro-Optics (CLEO/Europe), 10-Sep. 2000, Nice, France, (0-7803-6319-1) p. 317; and U.S. Pat. No. 5,623,508, "Article comprising a counter-pumped optical fiber Raman amplifier" Grubb, et al. Apr. 22, 1997, which are incorporated herein by reference.

Figure 14:
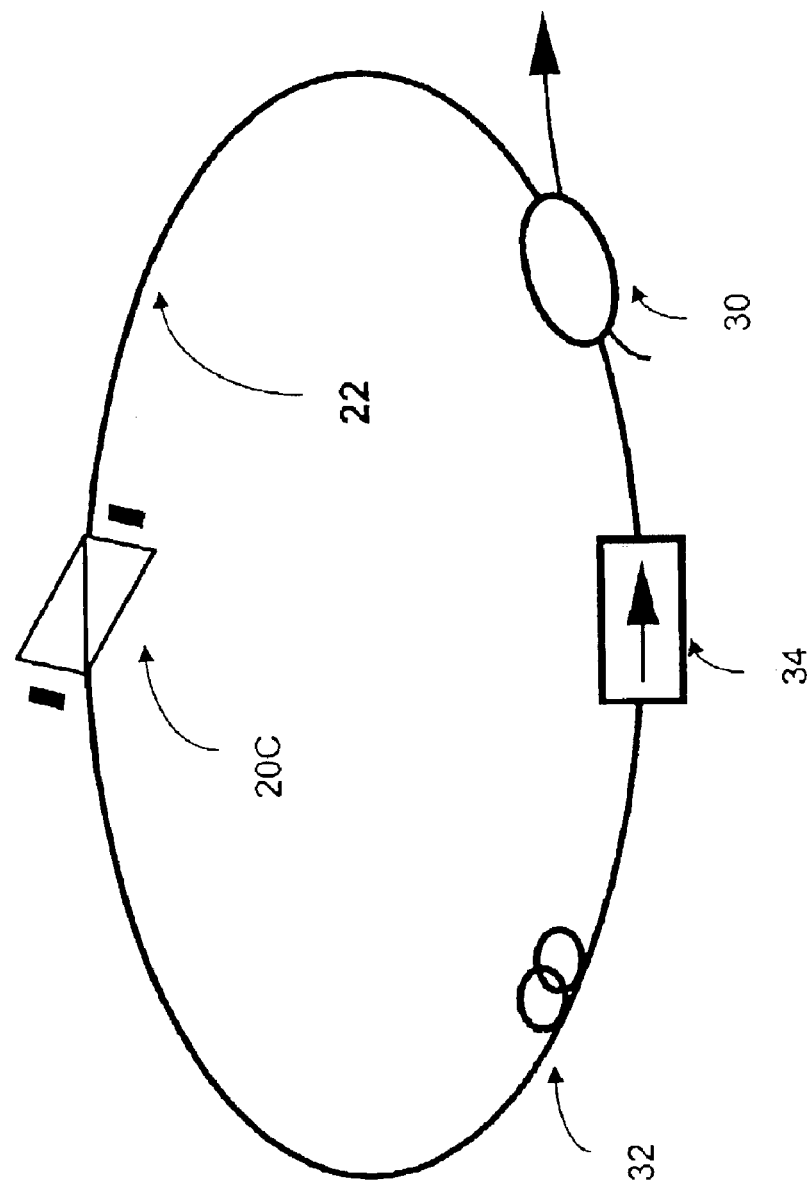
FIG. 14 is a schematic diagram showing loop configuration for the device of FIG. 2.

FIG. 14 illustrates one example of the ring configuration of the device of FIG. 2. The ring of FIG. 14 achieves noise suppression, including isolators for unidirectional operation or may be a symmetric construction. The device of FIG. 14 includes an optical source, in the form of two sided pump lasers 20C, and an output coupler 30 for coupling light in both directions for bi-directional operation. For bi-directional operation, the lasers 20C include a first laser and a second laser or mirror. For unidirectional operation, only one laser may be provided. The loop fiber shown in FIG. 14 may include a polarization controller 32 and a Faraday isolator 34 for unidirectional operation. The arrangement of FIG. 9 can also be used in a ring, without the grating mirror 86.

The present invention lends itself to this approach in either unidirectional or bi-directional configuration. In the ring configuration, light propagates in both directions. In this case, the grating couples light into and out of both sides of the fiber with mirror symmetry. To account for this, a laser could be constructed with symmetrically placed optical sources on either side of the fiber; however, a mirror could replace one of the sources. Ring operation tends to average out noise.

The laser diode design is now described in further detail. For example, multiple stripe sources may be fabricated with a high reflector at one end of the fiber 22, and an anti-reflection, or curved stripe at the far output end of the fiber 22. The individual sources may operate as CW sources at the same, or different wavelengths. In addition, the sources may be pulsed or modulated. The sources may be close coupled to the fiber or coupled by optical elements.

The scaling is now described in detail. The approach in accordance with the embodiment of the present invention enables scaling of high power lasers to be coupled into a fiber. One or more large laser bars pumping multiple fibers, e.g. FIG. 12, is an example of the scaling. Further, the scaling also refers to the relationship among grating/laser/optics.

Figure 15:
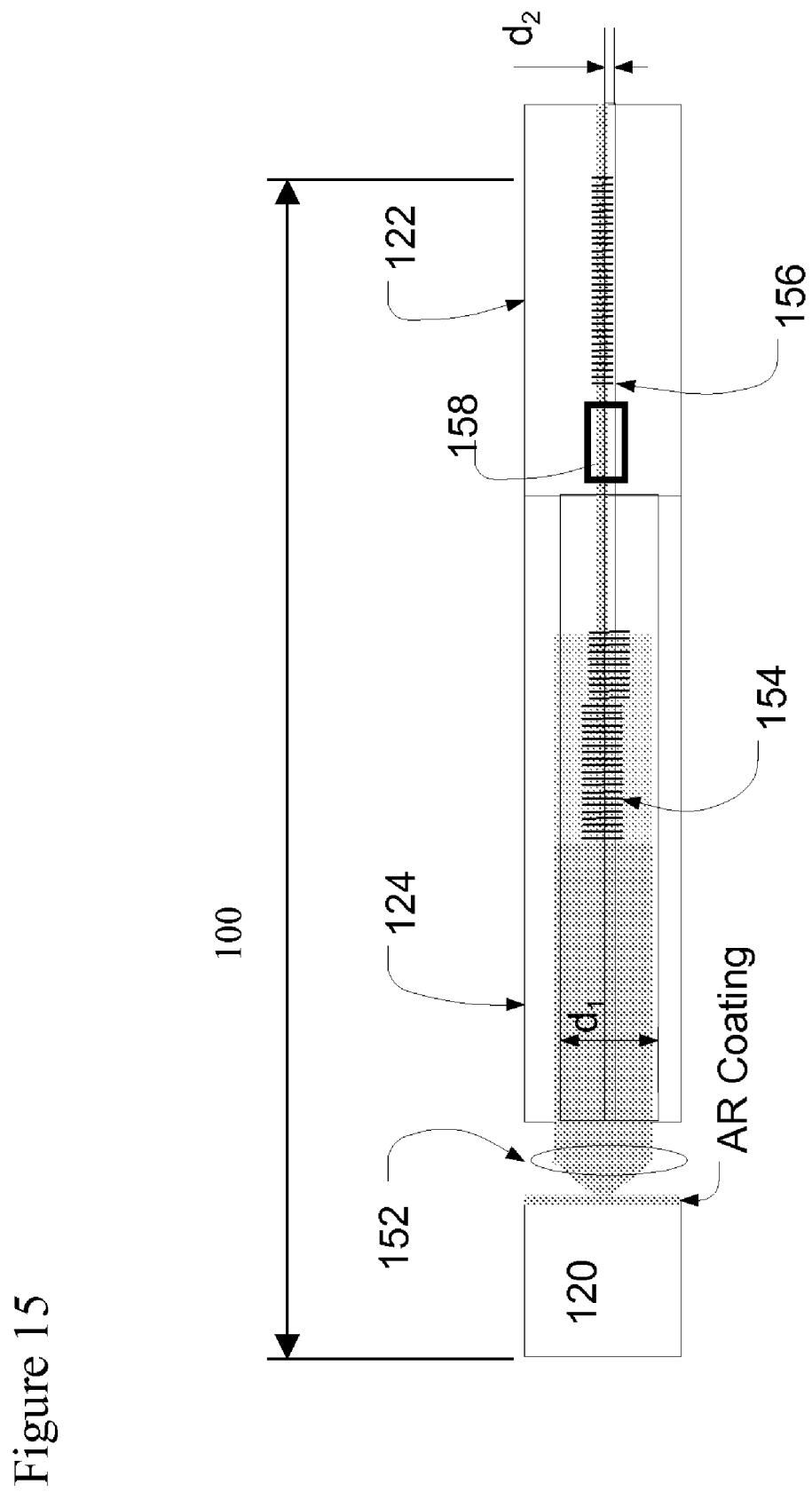
FIG. 15 is a schematic side view of a laser cavity according to the present invention.

With reference to FIG. 15, an alternative embodiment of a laser cavity 100 of the present invention includes an optical source 120, e.g. a laser diode, coupled to a small diameter optical fiber 122, e.g. single mode fiber, with a core diameter $d_2$ via a larger core fiber 124, e.g. a double clad fiber, with a core diameter $d_1$. In the exemplary embodiment the small diameter optical fiber 122 is a single mode fiber, but any diameter fiber can apply as long as there is an intra-cavity step down in fiber size, i.e. $d_1 > d_2$. An anti-reflection coating can be placed on the output of the optical source 120 to minimized back reflections. Coupling optics 152, e.g. a convex lens, couples the light from the optical source 120 onto a long-period first Bragg grating 154, which reduces the size and/or direction of the propagating mode from the larger double clad region 124 to the smaller region of the small diameter optical fiber 122 up to but excluding acting as a retro-reflector. An output coupler, in the form of a second Bragg grating 156 (reflectivity <100%), is provided in the region of the small diameter optical fiber 122 defining one end of an optical cavity. The optical source 120 defining another end of the optical cavity. If the second grating 156 has a tilt angle greater than 0°, the light will be coupled out of the side of the optical fiber 122, as illustrated above. Accordingly, the surface area over which light can be coupled into and out of the small diameter optical fiber 122 is increased, while the size of the small diameter optical fiber 122, e.g. output fiber, is kept small. As above, a gain medium can be disposed between the first and second gratings 154 and 156 to form a semiconductor laser cavity between the optical source 120 and the second grating 156. Subsequent embodiments provide arrangements in which the gain medium is at a different wavelength than the first and second gratings 154 and 156, i.e. FIGS. 16 and 17 relate to amplifiers, while FIGS. 18 and 19 relate to wavelength converters.

In place of the long period first Bragg grating 152, an alternative mode reducing/converting means can be provided; for example, a fiber GRIN lens can be disposed between the first section 122 and the second section 124. A fiber GRIN lens is a relatively short length (200 µm to 2 mm) of gradient index multi-mode fiber, whose refractive power is a function of its index profile and its length. Fiber GRIN lenses are disclosed in "Low-Loss High-Strength Microstructured Fiber Fusion Splices Using GRIN Fiber Lenses," A. D. Yablon and R. Bise, OFS, Optical Fiber Conference 2004, (http://www.ofsoptics.com/resources/documents/OFC04-GrinFiberLenses.pdf), which is incorporated herein by reference. Alternatively, an all-fiber high-performance fundamental-mode beam expander utilizing frozen-in viscoelasticity can be used, as described in "Stresses and Strains Frozen into Optical Fibers", A. D. Yablon, OFS, Optical Fiber Conference 2004, (http://www.ofsoptics.com/resources/documents/OFC04-StressStrain.pdf), which is incorporated herein by reference. An adiabatic fiber taper can also be used in place of the long period first Bragg grating 152.

As with the embodiments of FIG. 6, a filter 158, e.g. a gain flattening filter, an interleaver, a band-pass filter, a filter to control the width of the individual channels or a filter, which causes the signal to be discrete or channelized independent of the optical source 120, can be disposed within the optical cavity 200.

Figure 16:
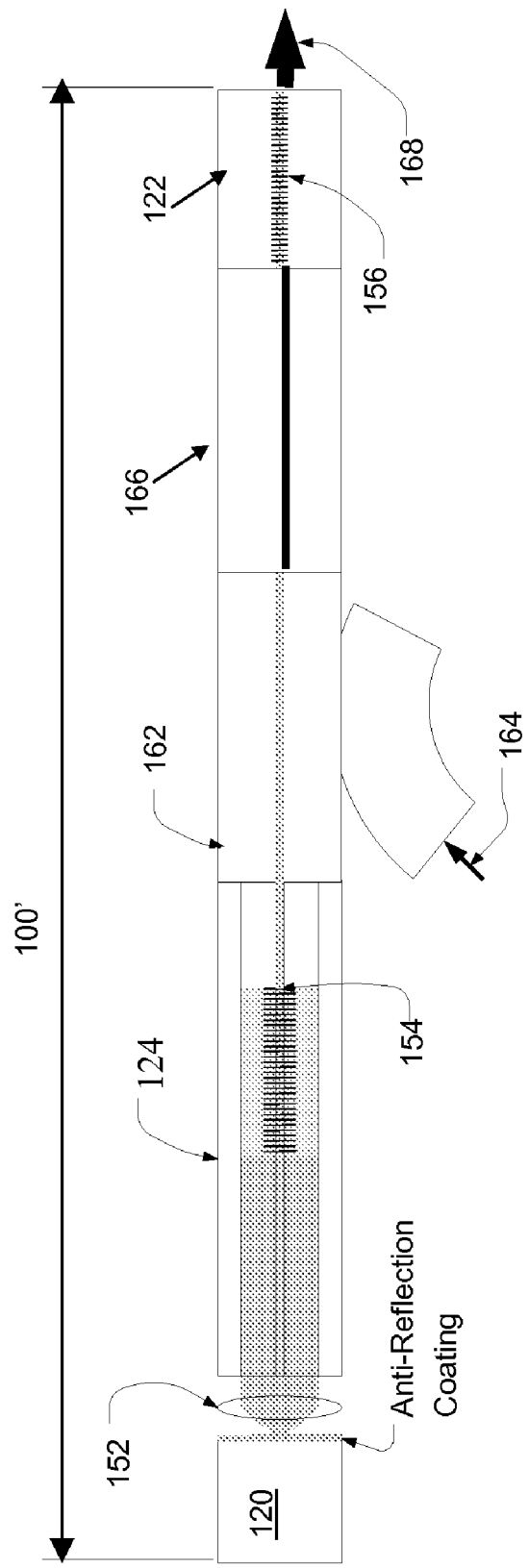
FIG. 16 is a schematic side view of the laser cavity of FIG. 15 in an intra-cavity amplifier.

FIG. 16 illustrates the embodiment of FIG. 15 used in a laser amplifier, in which a fiber coupler 162 is disposed inside a pump laser cavity 100', which is provided between the optical source 120 and the second grating 156, for inputting an optical signal 164 in need of amplification. A section of single mode fiber 166 doped with an amplifier gain material, e.g. a suitable rare earth material, is also positioned within the pump laser cavity for transferring the energy from the optical source 120 to the optical signal 164 forming amplified signal 168. The second grating 156 fully transmits the amplified signal 168, while fully reflecting the pump wavelength from optical source 120.

Figure 17:
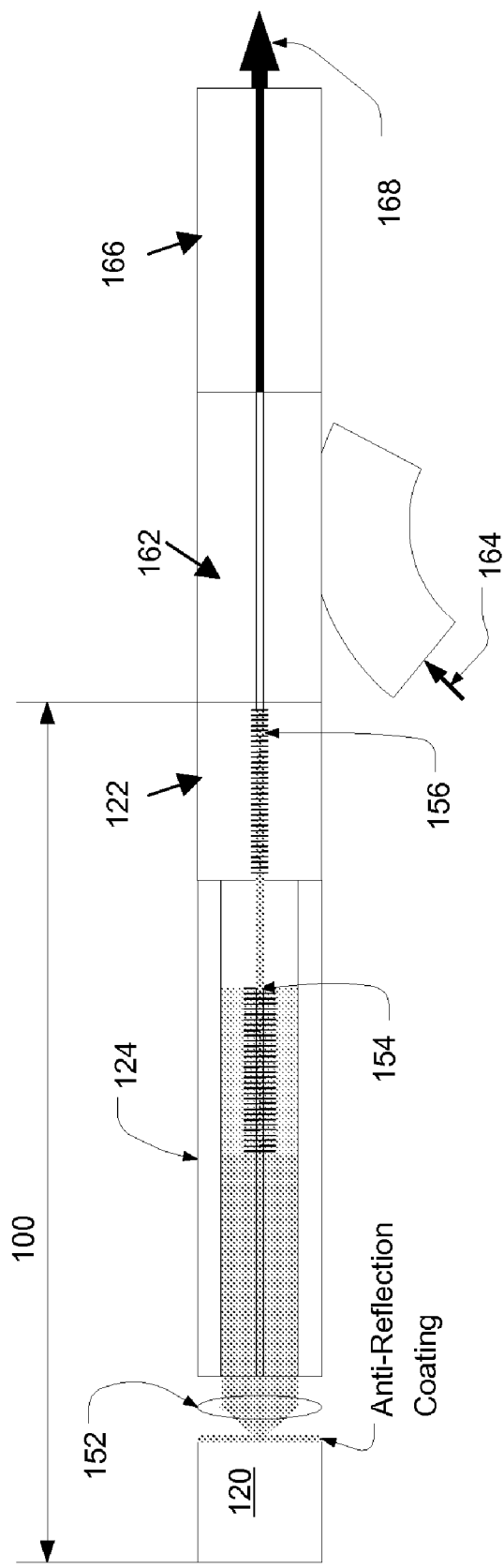
FIG. 17 is a schematic side view of the pump laser cavity of FIG. 15 in an alternative embodiment of an amplifier.

Alternatively, as illustrated in FIG. 17, a laser amplifier also can be formed by positioning the fiber coupler 162 and the doped single mode fiber section 166 outside of the pump laser cavity 100, same as above, for converting input signal 164 into amplified signal 168, which enables the pump laser 100 to be remote from the amplifier section 166, thereby eliminating the need for special fiber for propagating the pump energy between the pump laser 100 and the amplifier section 166.

Figure 18:
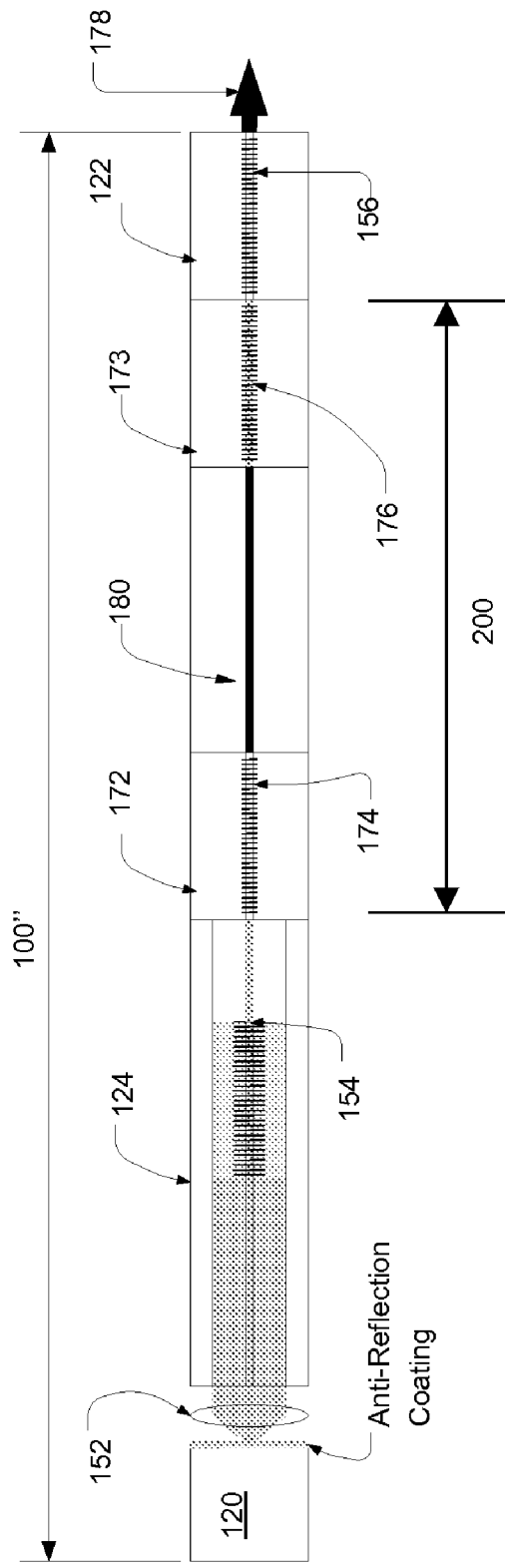
FIG. 18 is a schematic side view of the pump laser cavity of FIG. 15 in a wavelength/brightness converter.

A wavelength/brightness converter, see FIG. 18, is formed by inserting a second laser cavity 200 into the pump laser cavity 100". The second laser cavity 200 comprises first and second single mode fiber sections 172 and 173 with third and fourth Bragg gratings reflectors 174 and 176, respectively, in which the second Bragg grating 176 is an output grating, i.e. reflectivity of <100%. A gain medium 180 doped with a suitable dopant gain material, e.g. erbium, ytterbium, which lases at a wavelength $\lambda_2$ defined by the dopant and the third and fourth short Bragg gratings 174 and 176, is disposed between the third and fourth short Bragg gratings 174 and 176. With this geometry, the optical source 120, e.g. pump laser, is coupled into a single mode fiber 122 of the same diameter as the doped gain medium 166. The second laser cavity 200 at wavelength $\lambda_2$ is inside the pump laser cavity 100", so the pump power is higher than it would be if it were coupled out through an output coupler. The wavelengths $\lambda_1$ and $\lambda_2$ of the pump laser cavity 100" and the second laser cavity 200, respectively, are sufficiently different so that the grating reflectors don't interact, i.e. they are dichroic, so any grating, which is a high reflector or output coupler at one wavelength is invisible at the other. Accordingly, the pump laser is confined to the inner core, so the pumping is more efficient forming output light 178.

Figure 19:
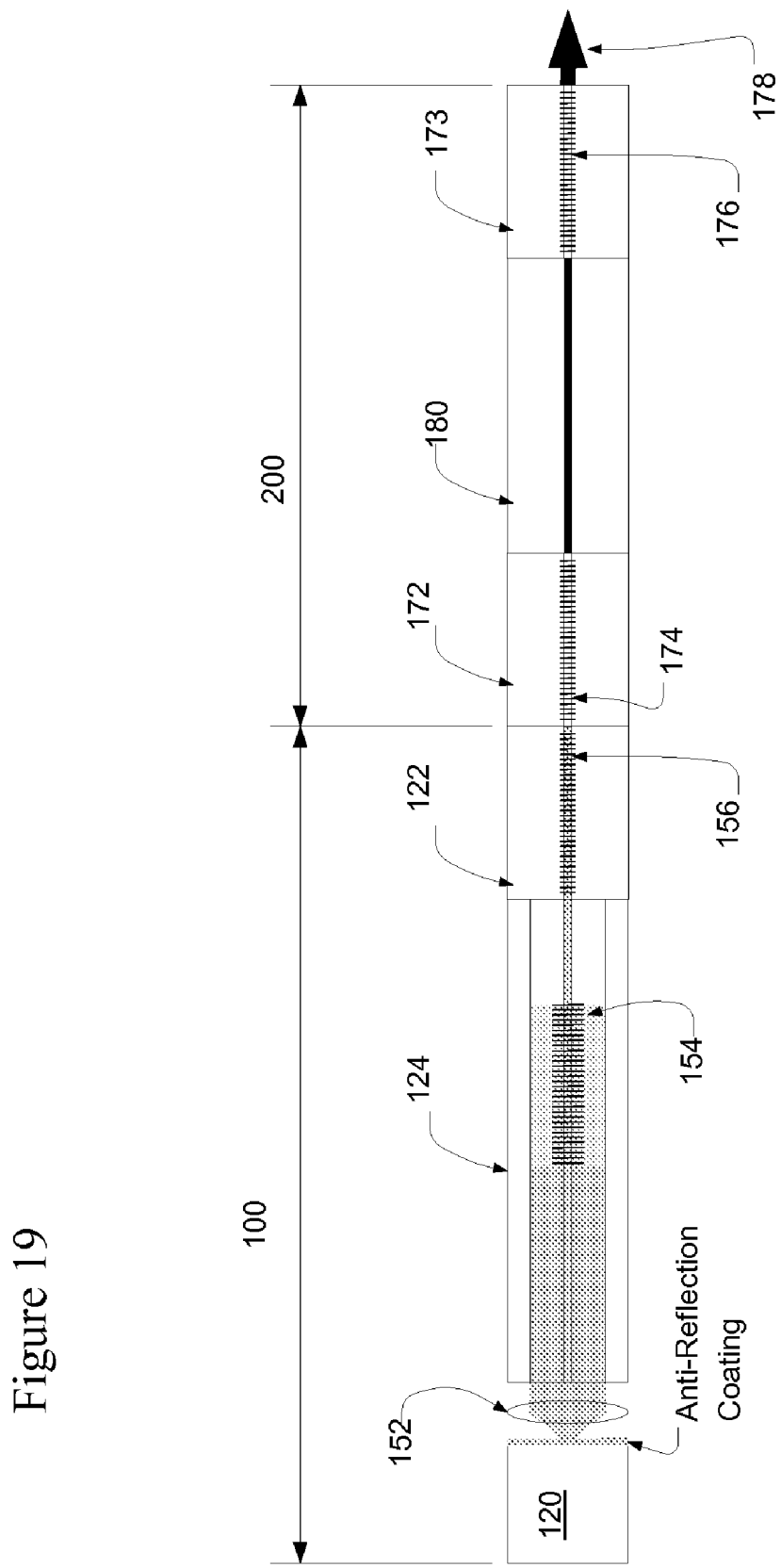
FIG. 19 is a schematic side view of the pump laser cavity of FIG. 15 pumping a conventional doped-fiber laser.

In an alternate embodiment, illustrated in FIG. 19, the second laser cavity 200 is disposed outside the pump laser cavity 100. As above, the remote positioning of the pump laser cavity 100 and the signal laser cavity 200 enables conventional fiber to be used in connecting them.

Figure 20:
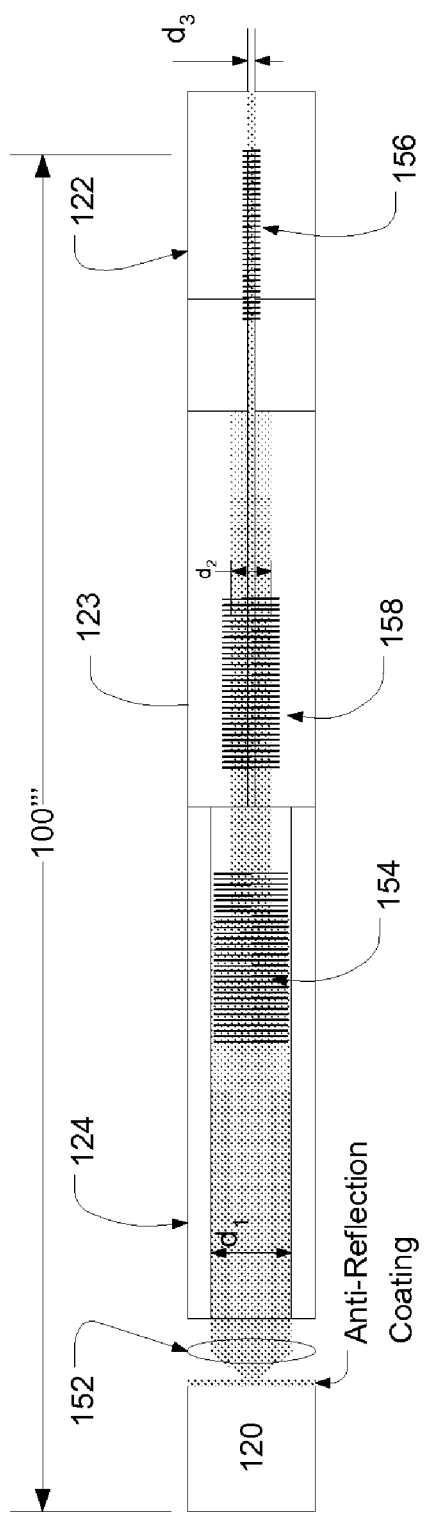
FIG. 20 is a schematic side view of an alternative embodiment of the present invention.

FIG. 20 illustrates another embodiment of the present invention, in which a staged reduction in fiber size of the laser cavity 100''', from $d_1$, to $d_2$ to $d_3$ is used. As above, the output coupler, in the form of the second Bragg grating 156 (reflectivity <100%), is provided in the region of the small diameter optical fiber 122 defining one end of an optical cavity 100''', while the optical source 120 defines another end of the optical cavity 100'''. An intermediate sized fiber 123 with core diameter $d_2$, which is smaller than $d_1$ but larger than $d_2$, and an intermediate mode reducing means, e.g. a long period grating 158, is disposed between the large core fiber 124 and the small core fiber 122, which provides a more gradual reduction in fiber size and/or the use of larger sized core $d_1$ in the large core fiber 124. The three stage shown are for illustrative purposes and more stages may be included.

The device in accordance with the embodiment of the present invention may provide signals to communication systems, or provide light for micro-machine, cancer treatment (photodynamic therapy).

While particular embodiments of the present invention have been shown and described, changes and modifications may be made to such embodiments without departing from the true scope of the invention.

I claim:

1. An optical device for increasing the amount of optical power coupled into an optical fiber comprising:
    a light source for generating a beam of source light;
    an optical fiber having a first region including a first cladding and a first core optically coupled to the light source, and a second region a second cladding and a second core remote from the light source;
    a mode reducing means in the first region for directing at least a portion of the beam of source light from the light source into the second region;
    an output coupler in the second region for reflecting at least a portion of the beam of source light back towards the first region.

2. The optical device according to claim 1, wherein the light source is for directing the beam of source light through a side surface of the first region of the optical fiber into the first core; and wherein the mode reducing means is a low angle, tilted grating for redirecting the beam of source light to the output coupler.

3. The optical device according to claim 2, wherein the optical fiber includes a third region doped with a rare earth gain material between the mode reducing means and the output coupler forming a laser amplifier for amplifying an optical signal traveling along the optical fiber.

4. The optical device according to claim 3, wherein the output coupler is a Bragg grating, which reflects light at a specific wavelength corresponding to a wavelength in the beam of source light, but transmits the optical signal.

5. The optical device according to claim 2, further comprising coupling optics index matched to the first cladding for collecting the beam of source light and focusing the beam of source light into the mode reducing means.

6. The optical device according to claim 2, wherein the optical fiber includes a gain medium between the mode reducing means and the output coupler, whereby a laser cavity is formed between the light source and the output coupler.

7. The optical device according to claim 2, wherein the mode reducing means is a tilted grating, chirped or multiple-discrete for coupling multiple wavelengths or wavelength range.

8. The optical device according to claim 2, wherein the fiber includes a filter disposed between the mode reducing means and the output coupler for defining multiple wavelengths as desired wavelengths and spacing.

9. The optical device according to claim 2, wherein the fiber includes a filter disposed between the mode reducing means and the output coupler for outputting a constant amplitude signal as a function of wavelength.

10. The optical device according to claim 1, wherein the first core has a diameter larger than the second core; and wherein the light source is optically coupled to an end of the first core.

11. The optical device according to claim 10, further comprising an optical fiber coupler for coupling an optical signal into the optical fiber; wherein the optical fiber includes a third region doped with a rare earth gain material for transferring optical power from the beam of source light to the optical signal.

12. The optical device according to claim 11, wherein the optical fiber coupler and the gain material are disposed between the mode reducing means and the output coupler.

13. The optical device according to claim 12, wherein the output coupler comprises a Bragg grating, which reflects light at a specific wavelength corresponding to a wavelength in the beam of source light.

14. The optical device according to claim 10, wherein the optical fiber includes a gain medium between the mode reducing means and the output coupler forming a first laser cavity between the optical source and the output coupler.

15. The optical device according to claim 14, wherein the gain medium is disposed in a second laser cavity defined by Bragg gratings on either side of the gain medium.

16. The optical device according to claim 10, wherein the mode reducing means is selected from the group consisting of a long period grating; a fiber GRIN lens; and an all-fiber high-performance fundamental-mode beam expander utilizing frozen-in visco-elasticity.

17. The optical device according to claim 10, wherein the first region comprises a double-clad fiber, and the second region comprises a single-mode fiber spliced to the first section.

18. The optical device according to claim 10, further comprising coupling optics for collecting the beam of light from the light source, and focusing the beam of light into the mode reducing means.

19. The optical device according to claim 10, wherein the fiber includes a filter disposed between the mode reducing means and the output coupler for defining multiple wavelengths as desired wavelengths and spacing or for outputting a constant amplitude signal as a function of wavelength.

20. The optical device according to claim 10, wherein the optical fiber further comprises:
    an intermediate region between said first and second regions having a third cladding and a third core, the third core having a diameter smaller than the diameter of the first core and larger than the diameter of the second core; and
    an intermediate mode reducing means in the intermediate region for directing at least a portion of the beam of source light from the first region into the second region.

* * * * *